(12) United States Patent
Kim

(10) Patent No.: US 10,347,866 B1
(45) Date of Patent: Jul. 9, 2019

(54) ORGANIC LIGHT EMITTING DISPLAY APPARATUS HAVING AN INSULATING DAM

(71) Applicant: SAMSUNG DISPLAY CO., LTD., Yongin-si, Gyeonggi-Do (KR)

(72) Inventor: Namjin Kim, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 16/130,472

(22) Filed: Sep. 13, 2018

(30) Foreign Application Priority Data

Feb. 20, 2018 (KR) .......................... 10-2018-0020013

(51) Int. Cl.
*H01L 51/52* (2006.01)
*H01L 27/32* (2006.01)
*H01L 51/00* (2006.01)

(52) U.S. Cl.
CPC ...... *H01L 51/5246* (2013.01); *H01L 27/3223* (2013.01); *H01L 27/3246* (2013.01); *H01L 51/0097* (2013.01); *H01L 51/5256* (2013.01)

(58) Field of Classification Search
CPC ............. H01L 51/5246; H01L 51/0097; H01L 27/3246; H01L 51/5256; H01L 27/3223
See application file for complete search history.

(56) References Cited

U.S. PATENT DOCUMENTS

| | | | |
|---|---|---|---|
| 9,276,047 | B2 | 3/2016 | Ko et al. |
| 2015/0034935 | A1 | 2/2015 | Choi |
| 2016/0315284 | A1 | 10/2016 | Jeon |
| 2016/0365398 | A1 | 12/2016 | Kim et al. |
| 2017/0117502 | A1 | 4/2017 | Park |
| 2018/0226454 | A1* | 8/2018 | Liu .................... H01L 27/323 |

FOREIGN PATENT DOCUMENTS

| | | |
|---|---|---|
| KR | 1020150020446 | 2/2015 |
| KR | 1020170047452 | 5/2017 |

* cited by examiner

*Primary Examiner* — Kyoung Lee
(74) *Attorney, Agent, or Firm* — F. Chau & Associates, LLC

(57) ABSTRACT

An organic light-emitting display apparatus includes a substrate including a display area, and a non-display area adjacent to the display area. A power source line is positioned in the non-display area. A display unit is arranged on the substrate. The display unit includes a thin film transistor. A display device is connected to the thin film transistor. A thin film encapsulation layer substantially covers the display area. The thin film encapsulation layer includes at least one organic layer and at least one inorganic layer. At least one insulating dam is arranged in the non-display area and surrounds the display area. A crack unit is adjacent to the at least one insulating dam in the non-display area. At least a part of the crack unit is in direct contact with the at least one insulating dam.

20 Claims, 9 Drawing Sheets

ORGANIC LIGHT EMITTING DISPLAY APPARATUS HAVING AN INSULATING DAM

CROSS-REFERENCE TO RELATED APPLICATION

This application claims priority under 35 U.S.C. § 119 to Korean Patent Application No. 10-2018-0020013, filed on Feb. 20, 2018, in the Korean Intellectual Property Office, the disclosure of which is incorporated by reference herein in its entirety.

1. Technical Field

Exemplary embodiments of the present invention relate to an organic light-emitting display apparatus, and more particularly to an organic light-emitting display apparatus having an insulating dam.

2. Discussion of Related Art

Display apparatuses may be used in mobile devices, for example, a smart phone, a laptop computer, a digital camera, a camcorder, a personal digital assistant (PDA), or electronic devices, for example, a desktop computer, a television, an outdoor advertisement board, a sample display device, an in-car instrument panel, or a head-up display (HUD).

Display apparatuses may be thin display apparatuses.

Flexible display apparatuses may be applied to various types of devices. Among various types of display apparatuses, flexible display apparatuses may employ organic light-emitting display technology. The flexible display apparatuses may be bent or curved.

Due to, for example, external impact, outdoor air and moisture may permeate into display areas of display apparatuses. As a result, the reliability of the display apparatuses may be decreased.

SUMMARY

According to an exemplary embodiment of the present invention, an organic light-emitting display apparatus may prevent outdoor air or moisture from permeating into a display area of the display apparatus.

According to an exemplary embodiment of the present invention, an organic light-emitting display apparatus includes a substrate including a display area, and a non-display area adjacent to the display area. A power source line is positioned in the non-display area. A display unit is arranged on the substrate. The display unit includes a thin film transistor. A display device is connected to the thin film transistor. A thin film encapsulation layer substantially covers the display area. The thin film encapsulation layer includes at least one organic layer and at least one inorganic layer. At least one insulating dam is arranged in the non-display area and surrounds the display area. A crack unit is adjacent to the at least one insulating dam in the non-display area. At least a part of the crack unit is in direct contact with the at least one insulating dam.

The crack unit may surround the at least one insulating dam. An edge of the crack unit may be connected to a lower end of a side wall of the at least one insulating dam facing the crack unit.

At least one insulating layer and at least one inorganic layer of the thin film encapsulation layer may extend to the non-display area. The crack unit may be arranged between the at least one insulating layer and the at least one inorganic layer of the thin film encapsulation layer extending to the non-display area.

A part of the at least one insulating dam may overlap the power source line.

The crack unit may surround the display area in a continuous belt form. The edge of the crack unit facing the at least one insulating dam may continuously be in direct contact with the side wall of the at least one insulating dam.

The crack unit may extend from the side wall of the at least one inorganic layer of the thin film encapsulation layer extending to the non-display area.

The crack unit may extend from the side wall of the at least one insulating dam. The crack unit may be arranged in an area in which the at least one organic layer of the thin film encapsulation layer, extending to the non-display area, is arranged.

A first crack unit and a second crack unit may extend in-parallel with each other and may be spaced apart from each other. The first and second crack units may each surround the display area in continuous belt forms. Among the first and second crack units, edges of at least one of the first and second crack units, facing the at least one insulating dam, may be continuously in direct contact with the side wall of the at least one insulating dam.

The first and second crack units may be separately arranged adjacent to the edge of the at least one inorganic layer of the thin film encapsulation layer extending to the non-display area.

A plurality of crack units may surround the display area. Among the plurality of crack units, edges of parts of at least one crack unit of the plurality of crack units, facing the at least one insulating dam, may be continuously in direct contact with the side wall of the at least one insulating dam.

The plurality of crack units may include a plurality of parts spaced apart from each other and arranged in a zigzag pattern.

The plurality of crack units may be separately arranged adjacent to the at least one inorganic layer of the thin film encapsulation layer extending to the non-display area.

The at least one insulating dam may include at least one organic material.

The crack unit may include at least one inorganic material.

The thin film transistor may include a semiconductor layer, a gate electrode, a source electrode, and a drain electrode. The at least one insulating layer may include a gate insulating layer arranged between the semiconductor layer and the gate electrode. An interlayer insulating layer may be arranged between the gate electrode, the source electrode and the drain electrode. A protection layer may substantially cover the source electrode and the drain electrode. A pixel defining layer may define a sub pixel in which the display element is arranged. A spacer may be arranged around the sub pixel. The at least one insulating layer may include the gate insulating layer and the interlayer insulating layer.

The at least one insulating dam may have a stack structure including an insulating material that is the same as a material of the plurality of insulating layers, the pixel defining layer, or the spacer. The at least one inorganic layer of the thin film encapsulation layer may extend to the non-display area, substantially covering outer surfaces of the at least one insulating dam.

According to an exemplary embodiment of the present invention, an organic light-emitting display apparatus includes a substrate including a display area, and a non-display area adjacent to the display area. A display unit is arranged on the substrate. The display unit includes a thin film transistor. A display element is connected to the thin film transistor. A thin film encapsulation layer substantially covers the display area and includes at least one organic layer and at least one inorganic layer. At least one insulating dam is arranged on the non-display area. The at least one insulating dam includes at least one organic material. A crack unit is arranged in the non-display area at an opposite side of the at least one insulating dam from the display area. The crack unit has at least a part in direct contact with the at least one insulating dam. The crack unit includes at least one inorganic material.

The crack unit may surround the at least one insulating dam. An edge of the crack unit may be connected to a lower end of a side wall of the at least one insulating dam facing the edge of the crack unit.

The thin film transistor may include a semiconductor layer, a gate electrode, a source electrode, and a drain electrode. Insulating layers may be respectively arranged between the semiconductor layer, the gate electrode, the source electrode, and the drain electrode. At least one insulating layer from among the insulating layers and the at least one inorganic layer of the thin film layer may extend to the non-display area. The crack unit may be arranged between the at least one insulating layer and the at least one inorganic layer of the thin film encapsulation layer extending to the non-display area.

The at least one insulating dam may have a stack structure including an insulating material including a same material as that of the at least one insulating layer. The at least one inorganic layer of the thin film encapsulation layer may surround the outer surfaces of the insulating dam and extend to the non-display area.

According to an exemplary embodiment of the present invention, an organic light-emitting display apparatus includes a display area and a non-display area adjacent to the display area. A first insulating dam is positioned in the non-display area and completely surrounds the display area in a plan view. A second insulating dam is positioned in the non-display area and completely surrounds the first insulating dam in a plan view. A crack unit is in direct contact with the second insulating dam at a side of the second insulating dam opposite the first insulating dam. A power source line crosses the first insulating dam and the second insulating dam. The crack unit is spaced apart from the power source line.

The organic light-emitting display apparatus may include an organic insulating layer positioned between the first insulating dam and the display area is a plan view.

BRIEF DESCRIPTION OF THE DRAWINGS

A more complete appreciation of the present invention will become more apparent by describing in detail exemplary embodiments thereof with reference to the accompanying drawings, in which.

DETAILED DESCRIPTION

Figure 1:
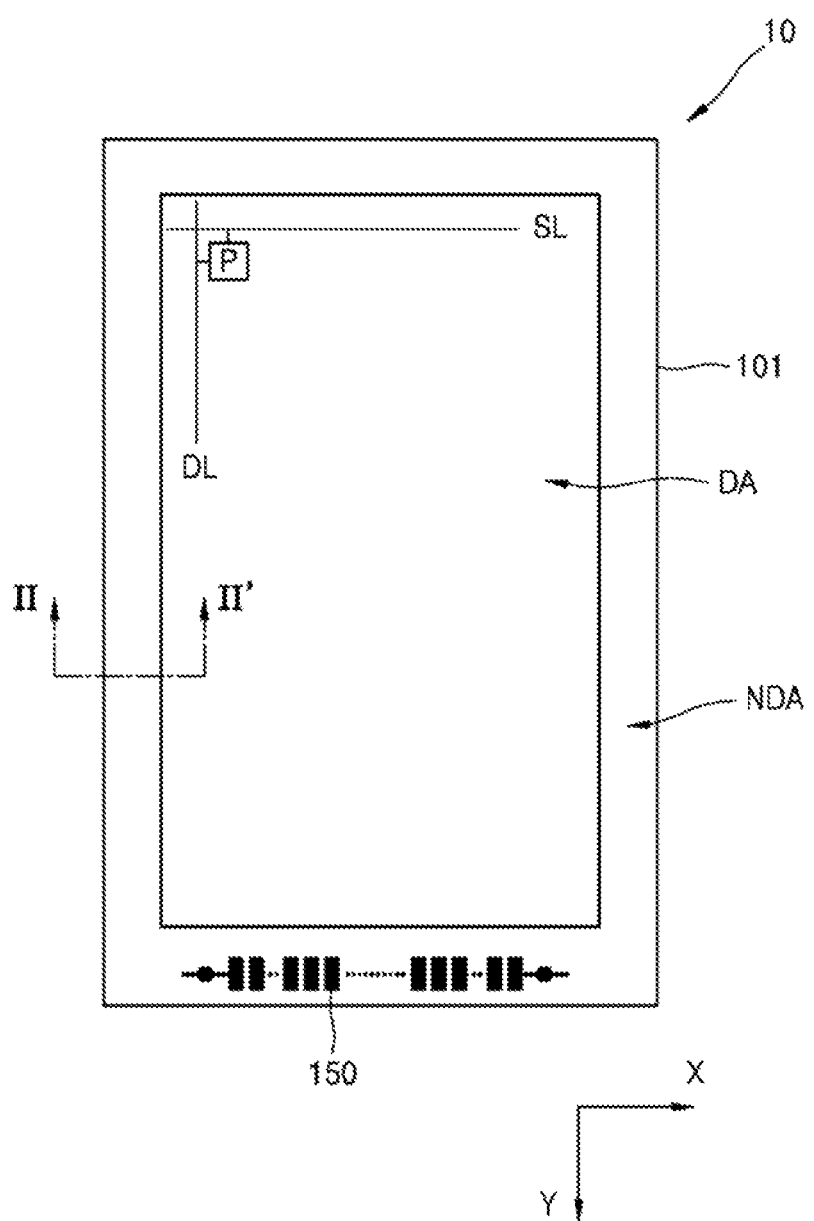
FIG. 1 is a top-plan view of an organic light-emitting display apparatus according to an exemplary embodiment of the present invention.

Exemplary embodiments of the present invention will be described below in more detail with reference to the accompanying drawings. In this regard, the exemplary embodiments may have different forms and should not be construed as being limited to the exemplary embodiments of the present invention described herein.

It will be understood that when a component, such as a layer, a film, a region, or a plate, is referred to as being "on" another component, the component may be directly on the other component or intervening components may be present.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

Like reference numerals may refer to like elements throughout the specification and drawings.

Figure 2:
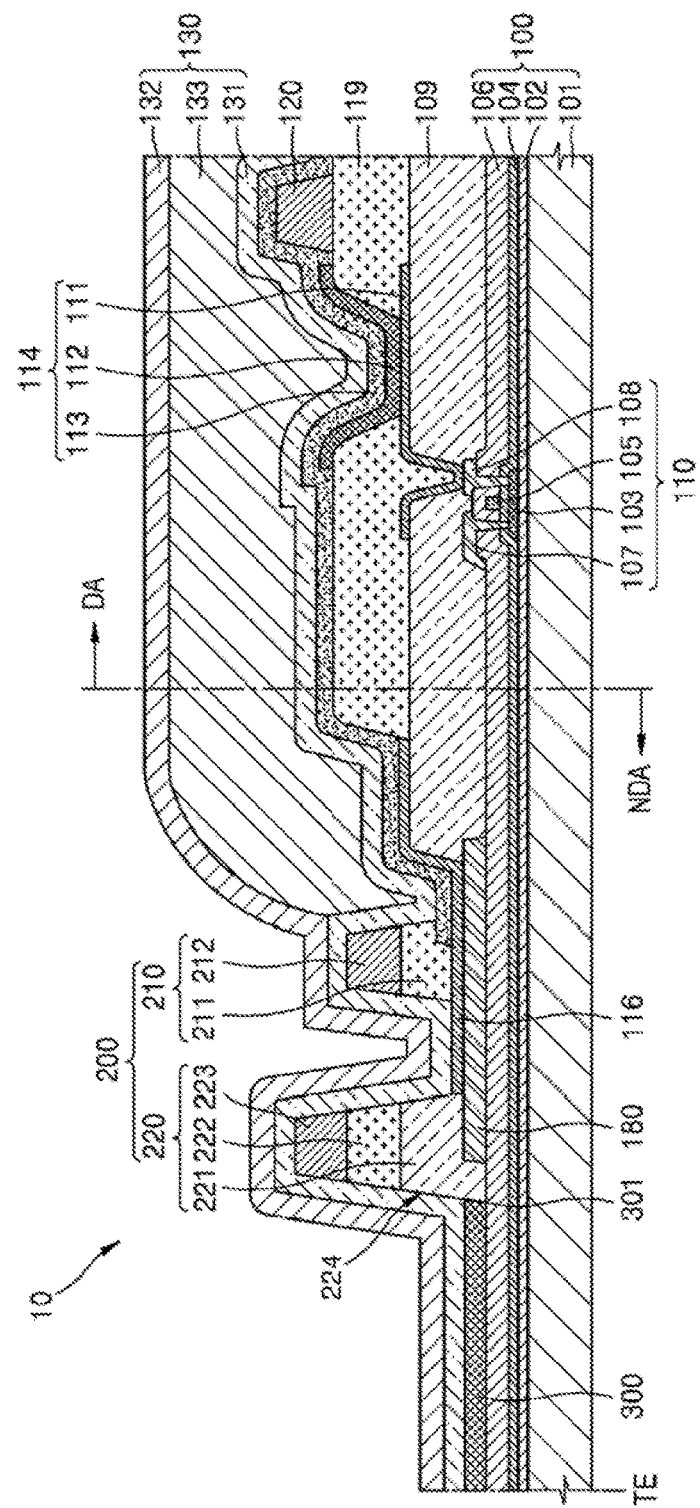
FIG. 2 is a cross-sectional view taken along line II-II' of FIG. 1.
Figure 3:
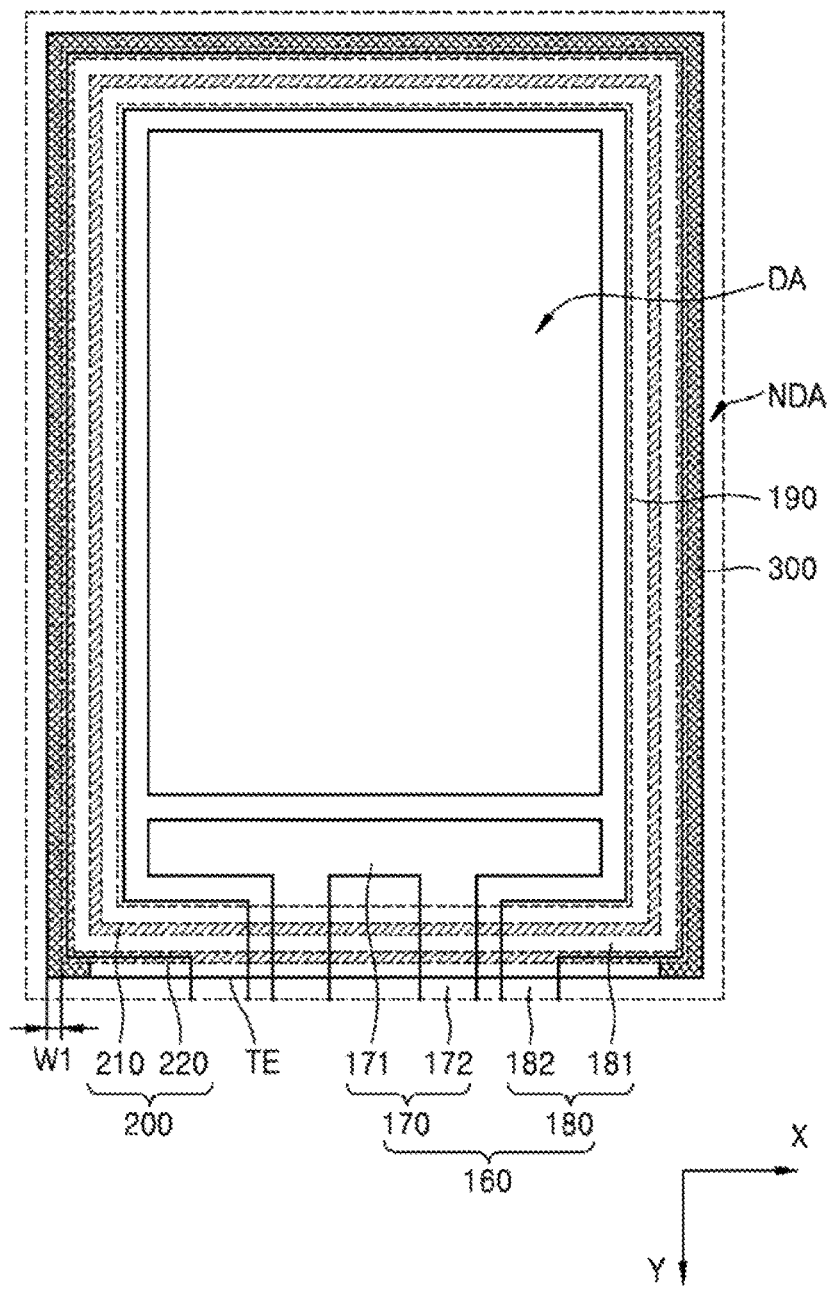
FIG. 3 is a top plan view of an arrangement of an insulating dam and a crack unit of FIG. 1.

FIG. 1 is a top-plan view of an organic light-emitting display apparatus according to an exemplary embodiment of the present invention. FIG. 2 is a cross-sectional view taken along line II-II' of FIG. 1. FIG. 3 is a top-plan view of an arrangement of an insulating dam and a crack unit of FIG. 1.

Referring to FIGS. 1 through 3, an organic light-emitting display apparatus 10 may include a substrate 101, a display unit 100, and a thin film encapsulation (TFE) layer 130.

The substrate 101 may be a glass substrate, a polymer substrate, or a flexible film; however, exemplary embodiments of the present invention are not limited to a particular substrate. The substrate 101 may be transparent, opaque, or semitransparent. The substrate 101 may have flexibility. Thus, the substrate 101 may be a curved, bent or folded substrate. The substrate 101 may be a bendable substrate that can exist in a flat state or a curved state, and the flat state or curved state may exist at different times. Thus, the substrate 101 may be permanently or reversibly in a curved, folded or bent state.

The display unit 100 may be arranged on the substrate 101. The display unit 100 may include a display area DA displaying images, and a non-display area NDA extending to an outer area of the display area DA. The non-display area NDA may be positioned at four sides of the display area DA in a plan view; however, exemplary embodiments of the present invention are not limited thereto. For example, the non-display area NDA may be positioned at less than four sides of the display area DA (e.g., at three or fewer sides of the display area DA).

A plurality of pixels P may be arranged in the display area DA. The plurality of pixels P may be located in an area where a data line DL and a scan line SL cross each other. As an example, the plurality of pixels P may be spaced apart from each other (e.g., in X and Y directions) and may be arranged in a plurality of rows and columns to form a matrix configuration. In the non-display area NDA, a power source line 160 supplying power to, for example, a display device 114, may be arranged. In an exemplary embodiment of the present invention, in the non-display area NDA, a pad unit 150, which transmits electric signals from a power supply device or a signal generator to the display area DA, may be arranged.

Referring to FIG. 2, a structure of the display unit 100 will be described in more detail below.

In the display unit 100, a switching thin film transistor and a storage capacitor Cst may be omitted. The display unit 100 may include a driving thin film transistor. The driving thin film transistor may be interchangeably referred to herein as a thin film transistor 110; however, exemplary embodiments of the present invention are not limited thereto.

On the substrate 101, a barrier layer 102 may be arranged. The barrier layer 102 may be formed directly on (e.g., in direct contact with) an upper surface of the substrate 101. The barrier layer 102 may include an inorganic material.

On the substrate 101, the thin film transistor 110 and the display device 114 electrically connected thereto may be arranged.

The thin film transistor 110 may include a semiconductor layer 103, a gate electrode 105, a source electrode 107, and a drain electrode 108. The thin film transistor 110 may be a top gate-type thin film transistor in which the semiconductor layer 103, the gate electrode 105, the source electrode 107, and the drain electrode 108 are sequentially arranged. However, in an exemplary embodiment of the present invention, various types of thin film transistors, like a bottom gate-type thin film transistor, may be applied.

The semiconductor layer 103 may include a semiconductor material, for example, amorphous silicon or polycrystalline silicon. However, exemplary embodiments of the present invention are not limited thereto, and the semiconductor layer 103 may include various materials. In an exemplary embodiment of the present invention, the semiconductor layer 103 may include an organic semiconductor material. In an exemplary embodiment of the present invention, the semiconductor layer 103 may include an oxide semiconductor material.

On the semiconductor layer 103, a gate insulating layer 104 may be arranged. The gate insulating layer 104 may be in direct contact with an upper surface of the barrier layer 102 facing away from the substrate 101. The gate insulating layer 104 may substantially cover the semiconductor layer 103. For example, the gate insulating layer 104 may be in direct contact and may cover upper and side surfaces of the semiconductor layer 103. The gate insulating layer 104 may include an inorganic material. For example, the gate insulating layer 104 may include silicon oxide and/or silicon nitride. The gate insulating layer 104 may have a single layer structure or a multilayer structure. The gate insulating layer 104 may insulate the gate electrode 105 from the semiconductor layer 103. The gate insulating layer 104 may extend from the display area DA to the non-display area NDA.

The gate electrode 105 may be arranged on the gate insulating layer 104. The gate electrode 105 may be connected to a gate line that applies on/off signals to the thin film transistor 110. As an example, the gate electrode 105 may be in direct contact with an upper surface of the gate insulating layer 104 facing away from the substrate 101.

The gate electrode 105 may include a relatively low resistance metal material. For example, the gate electrode 105 may include at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), or copper (Cu). The gate electrode 105 may have a single layer structure or a multilayer structure.

On the gate electrode 105, an interlayer insulating layer 106 may be arranged. The interlayer insulating layer 106 may substantially cover the gate electrode 105. For example, the interlayer insulating layer 106 may be in direct contact with upper and side surfaces of the gate electrode 106. The interlayer insulating layer 106 may include and inorganic material. For example, the interlayer insulating layer 106 may include silicon oxide and/or silicon nitride. The interlayer insulating layer 106 may have a single layer structure or a multilayer structure. The interlayer insulating layer 106 may insulate the gate electrode 105, the source electrode 107, and the drain electrode 108. The interlayer insulating layer 106 may extend from the display area DA to the non-display area NDA.

On the interlayer insulating layer 106, the source electrode 107 and the drain electrode 108 may be arranged. The source electrode 107 and the drain electrode 108 may each be in direct contact with an upper surface of the interlayer insulating layer 106 facing away from the substrate 101. The source electrode 107 and the drain electrode 108 may also be in direct contact with an area of the semiconductor layer 103. For example, the source electrode 107 and the drain electrode 108 may each penetrate the interlayer insulating layer 106 and the gate insulating layer 104 to come into direct contact with an upper surface of the semiconductor layer 103. The source electrode 107 and the drain electrode 108 may each include a metal material. For example, the source electrode 107 and the drain electrode 108 may each include at least one of Al, Pt, Pd, Ag, Mg, Au, Ni, Nd, Ir, Cr, Li, Ca, Mo, Ti, W, or Cu. The source electrode 107 and the drain electrode 108 may each have a single layer structure or a multilayer structure. For example, the source electrode 107 and the drain electrode 108 may each have a three-layer structure including Ti, Al, and Ti.

On the thin film transistor 110, a protection layer 109 may be arranged. The protection layer 109 may be in direct contact with an upper surface of the thin film transistor 110, and may also be in direct contact with an upper surface of the interlayer insulating layer 106. The protection layer 109 may substantially cover the source electrode 107 and the drain electrode 108 (e.g., upper and side surfaces of the source electrode 107 and the drain electrode 108). The protection layer 109 may include at least one of a passivation film or a planarization layer. The protection layer 109 may have a single layer structure or a multilayer structure. The protection layer 109 may include an organic material. For example, the protection layer 109 may include a polymer, such as, polymethylmethacrylate (PMMA), polystyrene (PS), polymer derivative including a phenolic group, acrylic polymer, imide polymer, aryl ether polymer, amide polymer, fluoropolymer, p-xylene polymer, vinyl alcohol polymer, or combinations thereof. In an exemplary embodiment of the present invention, the protection layer 109 may have a stack structure including inorganic insulating layers and organic insulating layers.

On the protection layer 109, the display device 114 may be arranged. The display device 114 may be in direct contact with an upper surface of the protection layer 109 facing away from the substrate 101. The display device 114 may be an organic light-emitting device (OLED) including a first electrode 111, a second electrode 113, and an intermediate layer 112 between the first electrode 111 and the second electrode 113.

The first electrode 111 may be arranged on (e.g., may be in direct contact with) the protection layer 109, and may also be electrically connected to the thin film transistor 110. The first electrode 111 may penetrate the protection layer 109 to come into direct contact with an upper surface of the source electrode 107 or with an upper surface of the drain electrode 108. The first electrode 111 may have various forms. For example, the first electrode 111 may be patterned into an island.

The first electrode 111 may be a reflective electrode. For example, the first electrode 111 may include a reflective layer including Ag, Mg, Al, Pt, Pd, Au, Ni, Nd, Ir, Cr, or combinations thereof, and a transparent electrode or a semi-transparent electrode, arranged on the reflective layer. The transparent electrode or the semitransparent electrode may each include at least one of indium tin oxide (ITO), indium zinc oxide (IZO), zinc oxide (ZnO), indium oxide ($In_2O_3$), indium gallium oxide (IGO), or aluminum zinc oxide (AZO).

The second electrode 113 may be a transparent electrode or a semitransparent electrode. For example, the second electrode 113 may include a metal thin film having a relatively small work function, including lithium (Li), calcium (Ca), lithium fluoride (LiF)/Ca, Lif/aluminum (Al), Al, silver (Ag), magnesium (Mg), or combinations thereof. In an exemplary embodiment of the present invention, the second electrode 113 may include a metal thin film, an auxiliary electrode on the metal thin film, or a bus electrode. The auxiliary electrode or the bus electrode may be formed by using materials like ITO, IZO, ZnO, or $In_2O_3$, which may be used for forming the transparent electrode. The second electrode 113 may transmit light emitted from an organic emission layer included in the intermediate layer 112. The light emitted from the organic emission layer may be reflected by the first electrode 111 and may be emitted toward the second electrode 113.

However, the display unit 100 of an exemplary embodiment of the present invention is not limited to a top-emission type and may be a bottom-emission type in which the light emitted from the organic emission layer is emitted toward the substrate 101. In this case, the first electrode 111 may include a transparent electrode or a semitransparent electrode, and the second electrode 113 may include a reflective electrode. In addition, the display unit 100 of an exemplary embodiment of the present invention may be a dual emission type that emits light in top and bottom directions.

On the first electrode 111, a pixel defining layer 119 may be arranged. The pixel defining layer 119 may be in direct contact with the upper surface of the protection layer 109, and may also be in direct contact with the first electrode 111. The pixel defining layer 119 may, by substantially covering edges of the first electrode 111, define a light-emitting area of each sub pixel. The pixel defining layer 119 may include an organic material. For example, the pixel defining layer 119 may include at least one organic material from among polyimide, polyamide, acrylic resin, benzocyclobutene, or phenolic resin. The pixel defining layer 119 may expose an area (e.g., a part of the upper surface) of the first electrode 111, and in the exposed area, the intermediate layer 112 including an organic emission layer may be located. The intermediate layer 112 may be in direct contact with the exposed upper surface of the first electrode facing away from the substrate 101.

An organic emission layer included in the intermediate layer 112 may include a relatively low molecular weight organic material or a polymer organic material. The intermediate layer 112 may also include a functional layer such as a hole transport layer (HTL), a hole injection layer (HIL), an electron transport layer (ETL), or an electron injection layer (EIL).

On the pixel defining layer 119, a spacer 120 may be arranged. The spacer 120 may be in direct contact with an upper surface of the pixel defining layer 119 facing away from the substrate 101. The spacer 120 may include an organic material. The spacer 120 may have a single layer structure or a multilayer structure. The spacer 120 may be arranged around a pixel area. The spacer 120 may increase an attachment or adhesion strength between the substrate 101 and the thin film encapsulation layer 130. For example, the adhesion strength may be increased by the increased surface area created by the spacer 120. The spacer 120 may prevent degradation of a display characteristic due to external impact. In an exemplary embodiment of the present invention, the pixel defining layer 119 and the spacer 120 may be substantially simultaneously formed by an exposure process using a half-tone mask.

The thin film encapsulation layer 130 may seal the display unit 100. For example, the thin film encapsulation layer 130 may seal the display area DA of the OLED apparatus 10, and a portion of the non-display area NDA of the OLED apparatus 10. The thin film encapsulation layer 130 may prevent oxygen and moisture from outside from permeating into the display unit 100. The thin film encapsulation layer 130 may include at least one inorganic layer, for example, first and second inorganic layers 131 and 132, and at least one organic layer. In the thin film encapsulation layer 130, the first inorganic layer 131, an organic layer 133, and the second inorganic layer 132 may be sequentially stacked. For example, a lower surface of the organic layer 133 may be in direct contact with an upper surface of the first inorganic layer 131 facing away from the substrate 101, and an upper surface of the organic layer 133 may be in direct contact with a lower surface of the second inorganic layer 132 facing the substrate 101. The thin film encapsulation layer 130 may include a plurality of organic layers and a plurality of inorganic layers that are alternatively and repeatedly stacked; and exemplary embodiments of the present invention are not limited to a particular number of layers in the thin film encapsulation layer 130.

The first inorganic layer 131 and the second inorganic layer 132 may each include an inorganic material. For example, each of the first inorganic layer 131 and the second inorganic layer 132 may include at least one of silicon nitride, aluminum nitride, zirconium nitride, titanium nitride, hafnium nitride, tantalum nitride, silicon oxide, aluminum oxide, titanium oxide, tin oxide, cerium oxide, or silicon oxynitride.

The organic layer 133 may include an organic material. For example, the organic layer 133 may include at least one of acrylic resin, methacrylic resin, polyisoprene, vinyl resin, epoxy resin, urethane resin, cellulose resin, or perylene resin.

Referring to FIGS. 2 and 3, the power source line 160 may be arranged in the non-display area NDA. The power source line 160 may include a first power source line 170 and a second power source line 180. In an exemplary embodiment of the present invention, the first power source line 170 may be an ELVDD line, and the second power source line 180 may be an ELVSS line. The second power source line 180 may be connected to the second electrode 113. Although the second power source line 180 and the second electrode 113 may be connected to each other (e.g., through a wiring 116), exemplary embodiments of the present invention are not limited thereto, and the second power source line 180 and the second electrode 113 may directly be connected to each other.

The first power source line 170 may include a first main line 171 and a first connection line 172. The first main line 171 may be adjacent to a side of the display area DA. When the display area DA is a rectangle, for example, the first main line 171 may be arranged at an edge of the display area DA. As an example, an edge of the first main line 171 facing an adjacent edge of the display area DA may extend substantially in-parallel with the edge of the display area DA. Thus, the first main line 171 may be arranged to be parallel to the edge of the display area DA. The edge of the display area DA corresponding to the first main line 171 may be an edge adjacent to the pad unit 150 (see, e.g., FIG. 1). The first connection line 172 may extend from the first main line 171 in the Y direction. The Y direction may be a direction from the display area DA to the pad unit 150, and the first connection line 172 may be electrically connected to the pad unit 150. The Y direction may be a direction along which a relatively longer dimension of the OLED apparatus extends, and an X direction may be a direction crossing (e.g., perpendicular to) the X direction.

The second power source line 180 may include a second main line 181 and a second connection line 182 extending from the second main line 181 in the Y direction. The second connection line 182 may be electrically connected to the pad unit 150. The second power source line 180 may be spaced apart from the first power source line 160. Thus, the second power source line 180 might not cross the first power source line 160. The second power source line 180 may at least partially surround the display area DA in a plan view.

In an exemplary embodiment of the present invention, the power source line 160 may be formed by using materials that are the same as the materials included in the source electrode 107 and the drain electrode 108. For example, the power source line 160 may have a three-layer structure including a first layer including Ti, a second layer including Al, and a third layer including Ti.

Referring to FIG. 3, an organic insulating layer 190 may extend to an outer area of the display area DA. The organic insulating layer 190 may be disposed in the non-display area NDA and may entirely surround the display area DA in a plan view. The organic insulating layer 190 may include an organic material such as, for example, a same material as a material included in the protection layer 109 or the pixel defining layer 119 (see, e.g., FIG. 2). The organic insulating layer 190, which may be an insulating layer substantially covering the elements arranged in the display area DA, is not limited to a certain kind of insulating layer. The organic insulating layer 190 may have a single layer structure or a multilayer structure. In an exemplary embodiment of the present invention, the organic insulating layer 190 may substantially cover inner edges of the second main line 181.

Referring to FIGS. 2 and 3, in the non-display area NDA extending outside of the display area DA (e.g., adjacent to the display area DA), at least one insulating dam 200 may be arranged. In an exemplary embodiment of the present invention, the insulating dam 200 may include a first insulating dam 210 and a second insulating dam 220. The second insulating dam 220 may be separately arranged from the first insulating dam 210. For example, the second insulating dam 220 may be spaced apart from the first insulating dam 210. The first insulating darn 210 and the second insulating dam 220 may each include an organic material. The first insulating dam 210 and the second insulating dam 220 may each surround the display area DA. Thus, the insulating dam 200 may be entirely arranged in the non-display area NDA without overlapping the display area DA.

During forming the organic layer 133 of the thin film encapsulation layer 130 (e.g., to seal the display unit 100), the first insulating darn 210 and the second insulating dam 220 may prevent organic materials from flowing in a direction of an edge of the substrate 101, thus preventing an edge tail of the organic layer 133 from being formed. In an exemplary embodiment of the present invention, the number of insulating dams 200 is not limited to a certain number.

The first insulating dam 210 may be arranged on (e.g., may overlap) the second power source line 180. The second insulating dam 220 may also be arranged to at least partially overlap the second power source line 180. The first insulating dam 210 may include at least one layer. The first insulating dam 210 may include a first dam region 211 and a second dam region 212 arranged on the first dam region 211. Thus, a lower surface of the second dam region 212 may be in direct contact with an upper surface of the first dam region 211 facing away from the substrate 110. A bottom surface of the first dam region 211 may be in direct contact with wiring 116. Side surfaces of each of the first dam region 211 and the second dam region 212 may be in direct contact with the first inorganic layer 131 of the thin film encapsulation layer 130.

The first dam region 211 and the second dam region 212 may be stacked in a vertical direction orthogonal to an upper surface of the substrate 101. The first dam region 211 may include an insulating material including a material that is the same as an insulating material of the pixel defining layer 119. The first dam region 211 may be formed by a same process and at substantially a same time as the pixel defining layer 119. Thus, the first dam region 211 may be arranged on a same layer as the pixel defining layer 119. The second dam region 212 may include an insulating material including a material that is the same as an insulating material of the spacer 120. The second dam region 212 may be formed by a same process and at substantially a same time as the spacer 120. Thus, the second dam region 212 may be arranged on a same layer as the spacer 120.

The second insulating dam 220 may be arranged at an outer area of the first insulating dam 210. For example, the second insulating dam 220 may be spaced further away from the display area DA than the first insulating dam 210, and may be spaced apart from the first insulating dam 210. A part of the second insulating dam 220 may be overlaid on the second power source line 180. For example, the second insulating dam 220 may substantially cover an outer edge of the second main line 181 included in the second power source line 180. The second insulating dam 220 may include at least one layer. The second insulating dam 220 may include a first dam region 221, a second dam region 222 arranged on the first dam region, and a third dam region 223 arranged on the second dam region 222. The first dam region 221 may be in direct contact with the interlayer insulating layer 106 and with the second power source line 180. A bottom surface of the second dam region 222 may be in direct contact with an upper surface of the first dam region 221 facing away from the substrate 110. An upper surface of the second dam region 222 may be in direct contact with a lower surface of the third dam region 223 facing the substrate.

The first dam region 221, the second dam region 222, and the third dam region 223 may be stacked in a vertical direction orthogonal to an upper surface of the substrate 101. The first dam region 221 may be formed by a same process and at substantially a same time as the protection layer 109.

Thus, the first dam region 221 may include a same insulating material as that of the protection layer 109 and may be arranged on a same layer as the protection layer 109. The second dam region 222 may be formed by a same process and at substantially a same time as the pixel defining layer 119. Thus, the second dam region 222 may includes a same insulating material as that of the pixel defining layer 119 and may be arranged on a same layer as the pixel defining layer 119. The third dam region 223 may be formed by a same process and at substantially a same time as the spacer 120. Thus, the third dam region 223 may include a same insulating material as that of the spacer 120 and may be arranged on a same layer as the spacer 120.

In an exemplary embodiment of the present invention, stack structures of the first insulating dam 210 and the second insulating dam 220 are not limited to a certain structure, or to a particular number of layers. For example, the first insulating dam 210 and the second insulating dam 220 may each include a same material as a plurality of insulating layers from among the protection layer 109, the pixel defining layer 119, and the spacer 120, and may be arranged on the same layer as the plurality of insulating layers.

In an exemplary embodiment of the present invention, a height of the insulating dam 200 may increase towards an edge of the substrate 101. For example, a height of the second insulating dam 220 may be greater than a height of the first insulating dam 210.

The first inorganic layer 131 and the second inorganic layer 132 of the thin film encapsulation layer 130 may substantially cover an outer surface of the first insulating dam 210 and an outer surface of the second insulating dam 220. The first inorganic layer 131 and the second inorganic layer 132 may extend to the non-display area NDA. In an exemplary embodiment of the present invention, edges TE of the first inorganic layer 131 and the second inorganic layer 132 may be spaced apart from the outside of the second insulating dam 220 opposite the first insulating dam 210.

Recently, to reduce non-display areas, outskirt margins are being eliminated from organic light-emitting display apparatuses. However, when the outskirt margins of the non-display area is reduced, there might not be enough room for a structure blocking cracks that may alleviate external impact. Cracks caused due to external impact may be paths through which outdoor air or moisture permeate, and outdoor air or moisture may permeate into the display area DA. Accordingly, pixel shrinkage may be caused within the display area DA.

In an exemplary embodiment of the present invention outdoor air or moisture may be prevented from permeating into the display area DA. For example, a crack unit 300 may be arranged outside the insulating dam 200. The crack unit 300 may surround the insulating dam 200. For example, the crack unit 300 may surround the insulting dam 200 on an opposite side of the insulating dam 200 from the display area DA. At least a part of the crack unit 300 may be in direct contact with the insulating dam 200. For example, the crack unit 300 may be in direct contact with the second insulating dam 220. An edge 301 of the crack unit 300 may be connected to a lower end of a side wall 224 of the second insulating dam 220, which may be a dam arranged at an outer area between the insulating dam 200 facing the edge 301 of the crack unit 300. A an example, a first part of the side wall 224 of the second insulating dam 220 may be in direct contact with the edge 301 of the crack unit 300 and a second part of the side wall 224 of the second insulating dam 220 may be in direct contact with the first inorganic layer 131 of the thin film encapsulation layer 130.

For example, the crack unit 300 may be arranged between the interlayer insulating layer 106, extending to the non-display area NDA, and the first inorganic layer 131 of the thin film encapsulation layer 130. The crack unit 300 may be patterned after the source electrode 107, the drain electrode 108, and the power source line 160 are formed. As an example, the crack unit 300 may be formed at substantially the same time as patterning of an insulating layer including an inorganic material for covering an edge of the first connection line 172 of the first power source line 170 and an edge of the second connection line 182 of the second power source line 180.

The crack unit 300 may have a continuous belt form and may surround the display area DA. For example, the crack unit 300 may completely surround the display area DA on three sides, and may partially surround the display area DA in a plan view (see, e.g., FIG. 3). The edge 301 of the crack unit 300, facing the second insulating dam 220, may continuously be in direct contact the side wall 224 of the second insulating dam 220, along an outskirt of the second insulating dam 220.

The crack unit 300 may extend from a portion connected to the side wall 224 of the second insulating dam 220 to edges TEs of the first and second inorganic layers 131 and 132 of the thin film encapsulation layer 130 that extends to the non-display area NDA. In an exemplary embodiment of the present invention, a width W1 of the crack unit 300 may be from about 50 μm to about 500 μm. As an example, the width W1 of the crack unit 300 may be about 100 μm, The crack unit 300 may include an inorganic material. For example, the crack unit 300 may include silicon oxide, silicon nitride, or silicon oxynitride. A thickness of the crack unit 300 may be from about 2000 Å to about 5000 Å.

The second insulating dam 220 may include an organic material. For example, the first dam region 221, the second dam region 222, and the third dam region 223, which may be included in the second insulating dam 220, may each include an organic material.

The crack unit 300 that includes an inorganic material may be relatively fragile to external impacts. The second insulating dam 220 that includes an organic material may absorb (e.g., may be relatively strong against) external impacts. When there are external impacts, cracks from the crack unit 300 can be transmitted to the lower end of the side wall 224 of the second insulating dam 220 connected to the crack unit 300. However, the crack transmitted to the second insulating dam 220 may be blocked by the second insulating dam 220 and not proceed toward the display area DA. Thus, an occurrence to damage or defects in the display area DA may be reduced or eliminated, and reliability and longevity of a display apparatus may be increased.

According to an exemplary embodiment of the present invention, an organic light-emitting display apparatus may include the display area DA and the non-display area NDA adjacent to the display area DA. The first insulating dam 210 may be positioned in the non-display area NDA and may completely surround the display area DA in a plan view. The second insulating dam 220 may be positioned in the non-display area NDA and may completely surround the first insulating dam 210 in a plan view. The crack unit 300 may be in direct contact with the second insulating dam 220 at a side of the second insulating dam 220 opposite the first insulating dam 210. The power source line 160 may cross the first insulating dam 210 and the second insulating dam 220. The crack unit 300 may be spaced apart from the power source line 160.

According to an exemplary embodiment of the present invention, the organic light-emitting display apparatus may include the organic insulating layer 190 positioned between the first insulating dam 210 and the display area DA is a plan view.

The crack unit 300 according to an exemplary embodiment of the present invention will be described in more detail below.

Figure 4A:
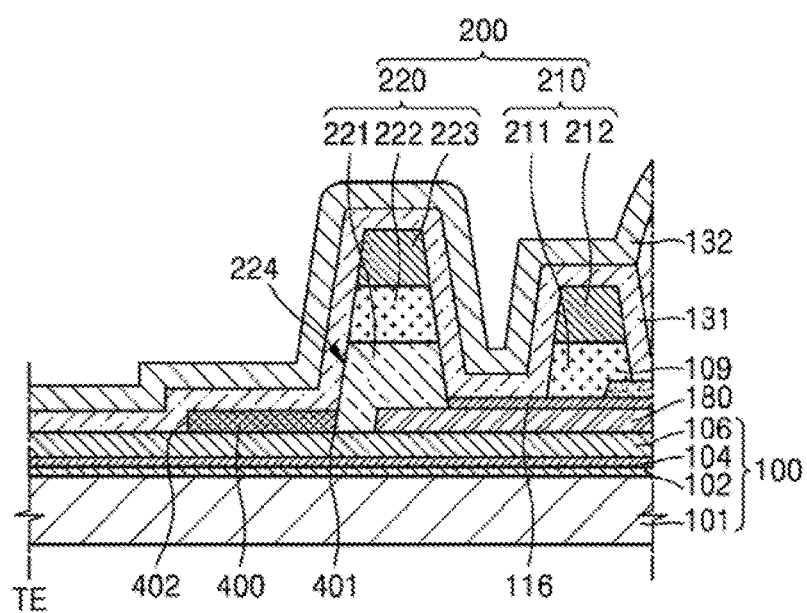
FIG. 4A is a cross-sectional view of an arrangement of an insulating dam and a crack unit according to an exemplary embodiment of the present invention.
Figure 4B:
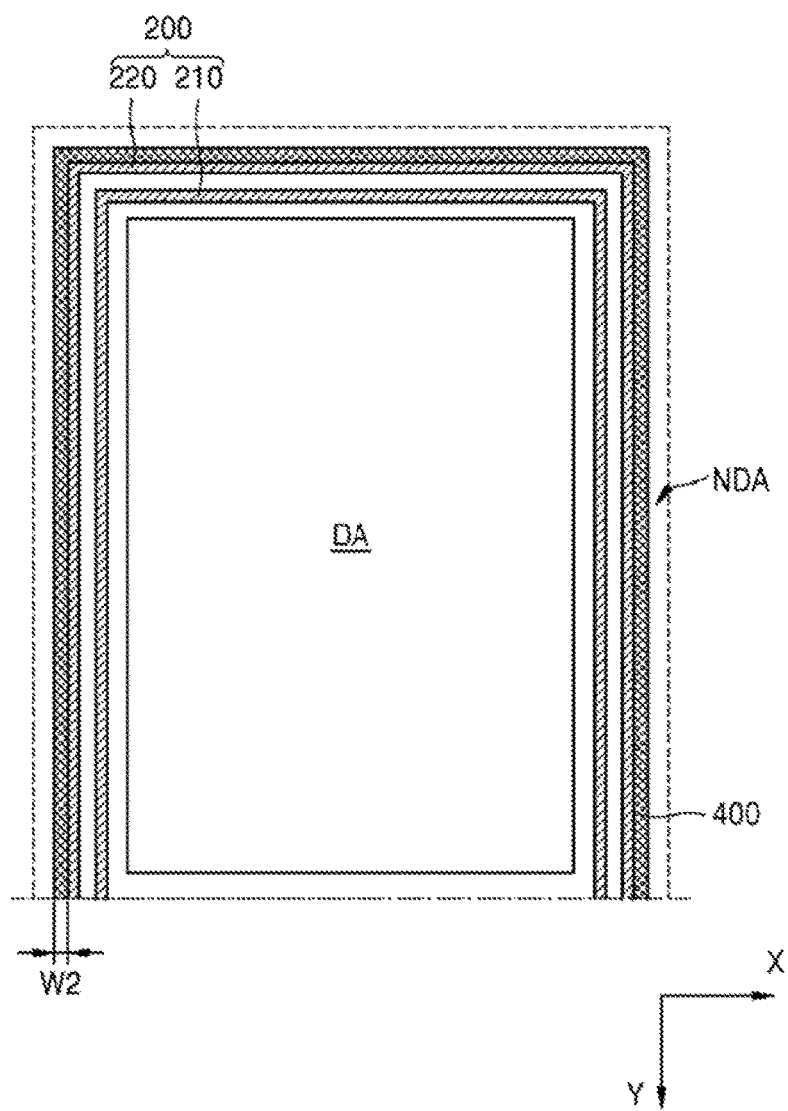
FIG. 4B is a top-plan view of an arrangement of an insulating dam and a crack unit of FIG. 4A.

FIG. 4A is a cross-sectional view of an arrangement of an insulating dam and a crack unit according to an exemplary embodiment of the present invention. FIG. 4B is a top-plan view of an arrangement of an insulating dam and a crack unit of FIG, 4A. The technical features described above with reference to FIGS. 1-3 may similarly be available to the exemplary embodiments of the present invention described below with reference to FIGS. 4A and 4B.

Referring to FIGS. 4A and 4B, a crack unit 400 may surround the insulating dam 200 (e.g., in a plan view). An edge 401 of the crack unit 400 may be connected to (e.g., in direct contact with) the lower end of the side wall 224 of the second insulating dam 220 facing the edge 401 of the crack unit 400.

The crack unit 400 may be arranged between the interlayer insulating layer 106 extending to the non-display area NDA and the first inorganic layer 131 of the thin film encapsulation layer 130. The crack unit 400 may have a continuous belt form and may surround the display area DA. The edge 401 of the crack unit 400, facing the second insulating dam 220, may continuously be in direct contact with the side wall 224 of the second insulating dam 220, along an outskirt of the second insulating dam 220.

The crack unit 400 may extend from a portion connected to the side wall 224 of the second insulating dam 230 and be arranged in an area where the first and second inorganic layers 131 and 132 of the thin film encapsulation layer 130 extending to the non-display area NDA are arranged. A width W2 of the crack unit 400 may be less than the width W1 of the crack unit 300 described above (e.g., with reference to FIG. 3). For example, the width W2 of the crack unit 400 may be from about 10 μm to about 90 μm.

The width W2 of the crack unit 400 may be about 50 μm. Another edge 402 of the crack unit 400 need not be exposed to the outside.

Figure 5A:
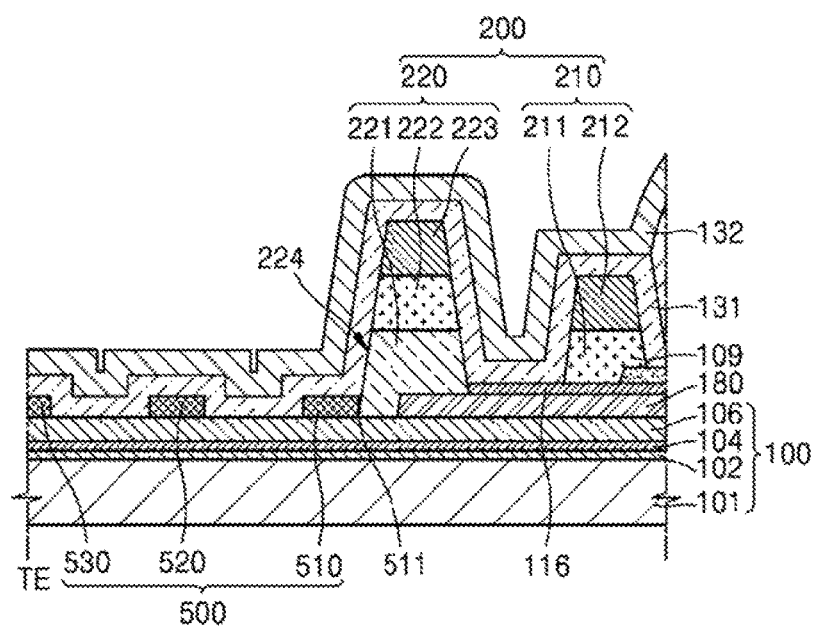
FIG. 5A is a cross-sectional view of an arrangement of an insulating dam and a crack unit according to an exemplary embodiment of the present invention.
Figure 5B:
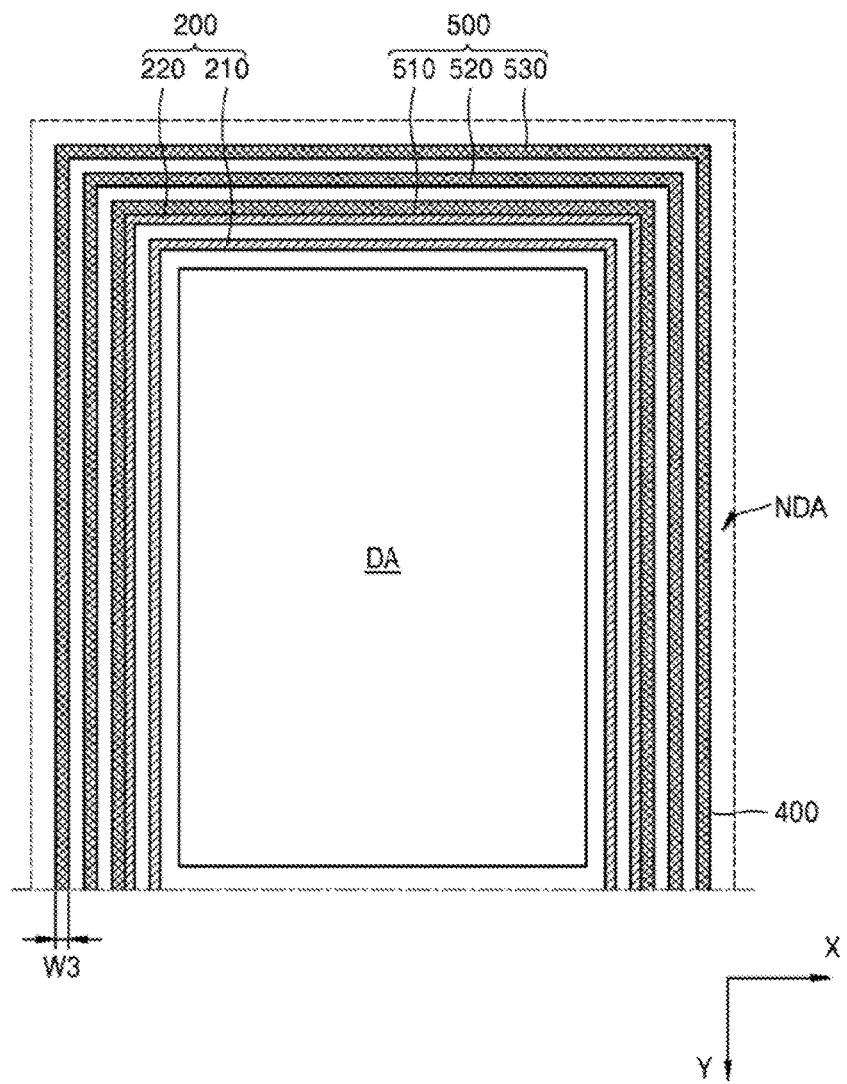
FIG. 5B is a top-plan view of an arrangement of an insulating dam and a crack unit of FIG. 5A.

FIG. 5A is a cross-sectional view of an arrangement of an insulating dam and a crack unit according to an exemplary embodiment of the present invention. FIG. 5B is a top-plan view of an arrangement of an insulating dam and a crack unit of FIG. 5A. The technical features described above with reference to FIGS. 1-3 may similarly be available to the exemplary embodiments of the present invention described below with reference to FIGS. 5A and 5B.

Referring to FIGS. 5A and 5B, a crack unit 500 may surround the insulating dam 200. An edge 511 of the crack unit 500 may be connected to (e.g., in direct contact with) the lower end of the side wall 224 of the second insulating dam 220 facing the edge 511 of the crack unit 500. The crack unit 500 may be arranged between the interlayer insulating layer 106 extending to the non-display area NDA and the first inorganic layer 131 of the thin film encapsulation layer 130.

The crack unit 500 may include a plurality of crack units. For example, the crack unit 500 may include a first crack unit 510, a second crack unit 520, and a third crack unit 530. The first crack unit 510, the second crack unit 520, and the third crack unit 530 may be separately arranged. For example, the first crack unit 510, the second crack unit 520, and the third crack unit 530 may be spaced apart from each other. The number of crack units 500 is not limited to a certain number. The first crack unit 510, the second crack unit 520, and the third crack unit 530 may each respectively have continuous belt forms and may surround the display area DA.

Among the first crack unit 510, the second crack unit 520, and the third crack unit 530, the edge 511 of the first crack unit 510, which faces the second insulating dam 220, may continually be in direct contact with the side wall 224 of the second insulating dam 220.

The first crack unit 510, the second crack unit 520, and the third crack unit 530 may be separately arranged with respect to edges TE of the first and second inorganic layers 131 and 132 of the thin film encapsulation layer 130 extending to the non-display area NDA. Each of the first crack unit 510, the second crack unit 520, and the third crack unit 530 may have a width W3 of about 10 μm, and gaps between the first crack unit 510, the second crack unit 520, and the third crack unit 530 may be about 10 μm. The widths W3 of the first crack unit 510, the second crack unit 520, and the third crack unit 530 and the gaps between them are not limited to certain sizes.

Figure 6A:
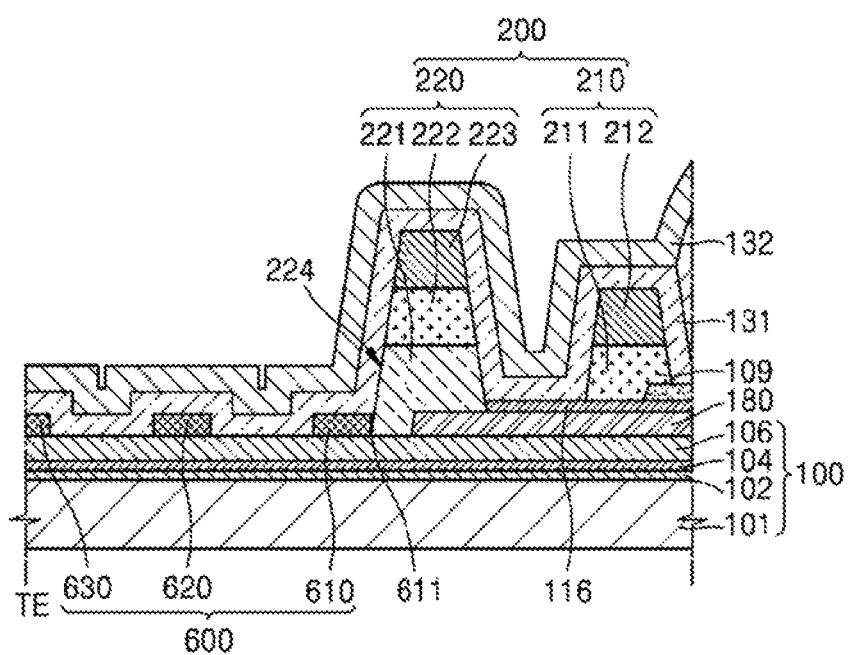
FIG. 6A is a cross-sectional view of an arrangement of an insulating dam and a crack unit according to an exemplary embodiment of the present invention.
Figure 6B:
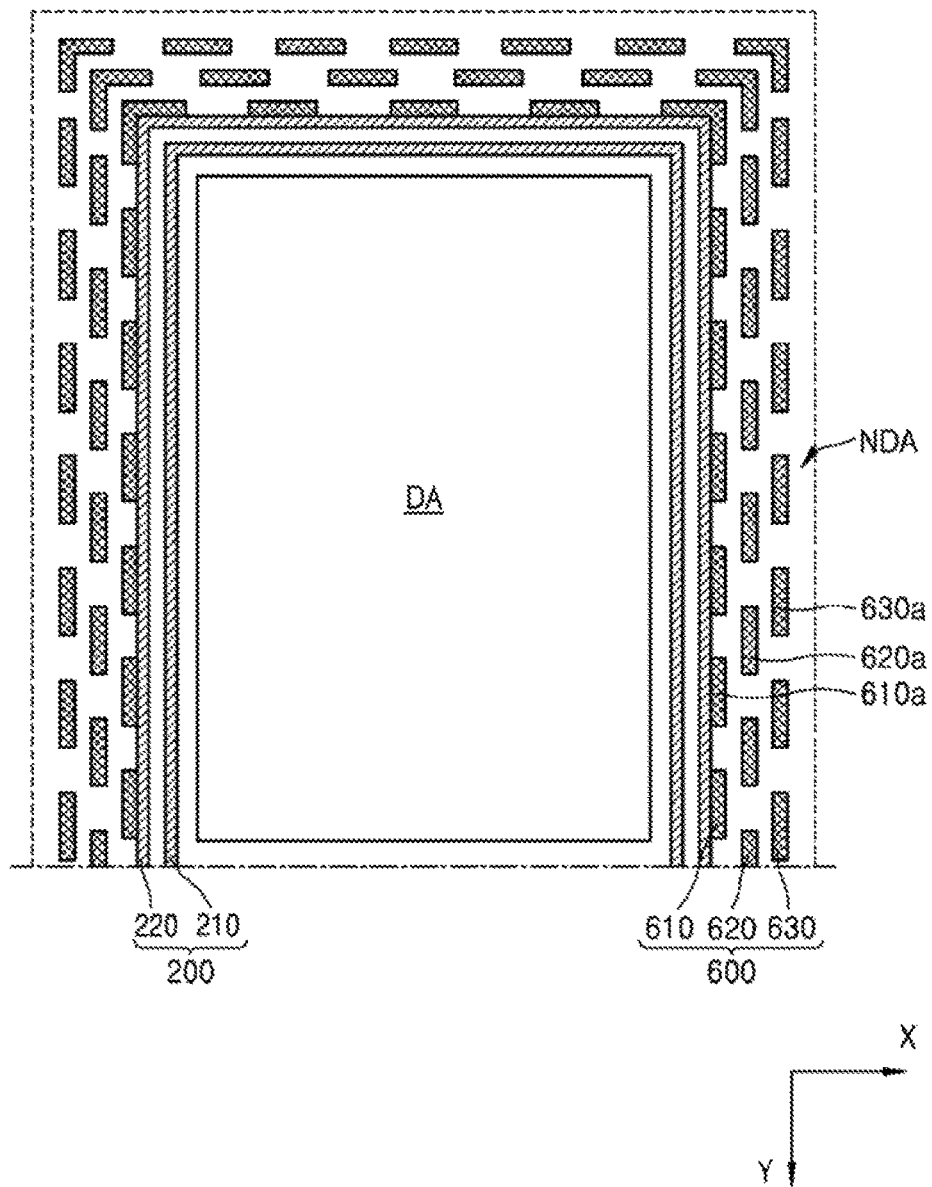
FIG. 6B is a top-plan view of an arrangement of an illustrating dam and a crack unit of FIG. 6A.

FIG. 6A is a cross-sectional view of an arrangement of an insulating dam and a crack unit according to an exemplary embodiment of the present invention. FIG. 6B is a top-plan view of an arrangement of an illustrating dam and a crack unit of FIG. 6A. The technical features described above with reference to FIGS. 1-3 may similarly be available to the exemplary embodiments of the present invention described below with reference to FIGS. 6A and 6B.

Referring to FIGS. 6A and 6B, a crack unit 600 may surround the insulating dam 200. An edge 611 of the crack unit 600 may be connected to (e.g., may be in direct contact with) the lower end of the side wall 224 of the second insulating dam 220 facing the edge 611 of the crack unit 600. The crack unit 600 may be arranged between the interlayer insulating layer 106 extending to the non-display area NDA and the first inorganic layer 131 of the thin film encapsulation layer 130.

The crack unit 600 may include a first crack unit 610, a second crack unit 620, and a third crack unit 630. The first crack unit 610, the second crack unit 620, and the third crack unit 630 may be separately arranged. For example, the first crack unit 610, the second crack unit 620, and the third crack unit 630 may be spaced apart from each other (e.g., in the X direction). The number of crack units 600 is not limited to a certain number.

The first crack unit 610, the second crack unit 620, and the third crack unit 630 may respectively include first areas 610a, second areas 620a, and third areas 630a separated from one another (e.g., respectively spaced apart from each other in the Y direction). For example, the first crack unit 610 may include a plurality of first areas 610a, and the first areas 610a may be separately arranged along an outskirt of the second insulating dam 220. The second crack unit 620 includes a plurality of second areas 620a, and the second areas 620a may be separately arranged along the outskirt of the second insulating dam 220. The third crack unit 630 includes a plurality of third areas 630a, and the third areas 630a may be separately arranged along the outskirt of the second insulating dam 220.

The first areas 610a, the second areas 620a, and the third areas 630a may each have belt forms with intermittent disconnections and may surround the display area DA.

Among the first crack unit 610, the second crack unit 620, and the third crack unit 630, edges 611 of the first areas 610*a* of the first crack units 610, which face the second insulating dam 220, may consecutively be in direct contact with the side wall 224 of the second insulating dam 220. The first crack unit 610, the second crack unit 620, and the third crack unit 630 may be separately arranged to edges TEs of the first and second inorganic layers 131 and 132 of the thin film encapsulation layer 130 extending to the non-display area NDA.

The first areas 610*a* of the first crack unit 610, the second areas 620*a* of the second crack unit 620, and the third areas 630*a* of the third crack unit 630, which are adjacent one another, may be arranged in zigzags (e.g., in a zigzag pattern). The first areas 610*a* of the first crack unit 610, the second areas 620*a* of the second crack unit 620, and the third areas 630*a* of the third crack units 630 may, besides a rectangle shape, include various forms, for example, a circle, or an oval.

In the organic light-emitting display apparatus according to an exemplary embodiment of the present invention, the crack unit including an inorganic material may be connected to an insulating dam including an organic material. Thus, cracks caused due to external impact and transmitted to the insulating dam through the crack unit may be prevented from being spread. For example, the cracks may be stopped at the insulating dam and may be prevented from spreading to the display area DA. Accordingly, it is possible to protect the display area from permeating outdoor air or moisture.

It should be understood that the exemplary embodiments of the present invention described herein should be considered in a descriptive sense and not for purposes of limitation. Descriptions of features or aspects within each exemplary embodiment should typically be considered as available for other similar features or aspects in other exemplary embodiments.

While the present invention has been shown and described with reference to the exemplary embodiments thereof, it will be apparent to those of ordinary skill in the art that various changes in form and detail may be made thereto without departing from the spirit and scope of the present invention.

What is claimed is:

1. An organic light-emitting display apparatus comprising:
    a substrate comprising a display area, and a non-display area adjacent to the display area, and a power source line positioned in the non-display area;
    a display unit arranged on the substrate and comprising a thin film transistor, and a display device connected to the thin film transistor;
    a thin film encapsulation layer substantially covering the display area and comprising at least one organic layer and at least one inorganic layer;
    at least one insulating dam arranged in the non-display area and surrounding the display area; and
    a crack unit adjacent to the at least one insulating dam in the non-display area, wherein at least a part of the crack unit is in direct contact with the at least one insulating dam.

2. The organic light-emitting display apparatus of claim 1, wherein
    the crack unit surrounds the at least one insulating dam, and
    an edge of the crack unit is connected to a lower end of a side wall of the at least one insulating dam facing the crack unit.

3. The organic light-emitting display apparatus of claim 2, wherein
    at least one insulating layer and at least one inorganic layer of the thin film encapsulation layer extend to the non-display area, and
    the crack unit is arranged between the at least one insulating layer and the at least one inorganic layer of the thin film encapsulation layer extending to the non-display area.

4. The organic light-emitting display apparatus of claim 3, wherein
    a part of the at least one insulating dam overlaps with the power source line.

5. The organic light-emitting display apparatus of claim 3, wherein
    the crack unit surrounds the display area in a continuous belt form, and
    the edge of the crack unit facing the at least one insulating dam is continuously in direct contact with the side wall of the at least one insulating dam.

6. The organic light-emitting display apparatus of claim 5, wherein
    the crack unit extends from the side wall of the at least one insulating dam to an edge of the at least one inorganic layer of the thin film encapsulation layer extending to the non-display area.

7. The organic light-emitting display apparatus of claim 5, wherein
    the crack unit extends from the side wall of the at least one insulating dam and is arranged in an area in which the at least one inorganic layer of the thin film encapsulation layer, extending to the non-display area, is arranged.

8. The organic light-emitting display apparatus of claim 3, wherein
    a first crack unit and a second crack unit extend in-parallel with each other and are spaced apart from each other,
    the first and second crack units each surround the display area in continuous belt forms, and
    among the first and second crack units, edges of at least one of the first and second crack units, facing the at least one insulating dam, are continuously in direct contact with the side wall of the at least one insulating dam.

9. The organic light-emitting display apparatus of claim 8, wherein
    the first and second crack units are separately arranged adjacent to the edge of the at least one inorganic layer of the thin film encapsulation layer extending to the non-display area.

10. The organic light-emitting display apparatus of claim 3, wherein
    a plurality of crack units surround the display area, and
    among the plurality of crack units, edges of parts of at least one crack unit of the plurality of crack units, facing the at least one insulating dam, is continuously in direct contact with the side wall of the at least one insulating dam.

11. The organic light-emitting display apparatus of claim 10, wherein
    the plurality of crack units comprise a plurality of parts spaced apart from each other and arranged in a zigzag pattern.

12. The organic light-emitting display apparatus of claim 10, wherein the plurality of crack units are separately arranged adjacent to the at least one inorganic layer of the thin film encapsulation layer extending to the non-display area.

13. The organic light-emitting display apparatus of claim 3, wherein
the thin film transistor comprises a semiconductor layer, a gate electrode, a source electrode, and a drain electrode, and
the at least one insulating layer comprises a gate insulating layer arranged between the semiconductor layer and a gate electrode, an interlayer insulating layer arranged between the gate electrode, the source electrode, and the drain electrode, a protection layer substantially covering the source electrode and the drain electrode, a pixel defining layer defining a sub pixel in which display elements are arranged, a spacer arranged around the sub pixel, wherein the at least one insulating layer comprises the gate insulating layer and the interlayer insulating layer.

14. The organic light-emitting display apparatus of claim 13, wherein
the at least one insulating dam has a stack structure comprising an insulating material that is the same as a material of the at least one insulating layer, the pixel defining layer, or the spacer, and
the at least one inorganic layer of the thin film encapsulation layer extends to the non-display area, substantially covering outer surfaces of the at least one insulating dam.

15. An organic light-emitting display apparatus comprising:
a substrate comprising a display area and a non-display area adjacent to the display area;
a display unit arranged on the substrate and comprising a thin film transistor and a display element connected to the thin film transistor;
a thin film encapsulation layer substantially covering the display area and comprising at least one organic layer and at least one inorganic layer;
at least one insulating dam arranged on the non-display area, and comprising at least one organic material; and
a crack unit arranged in the non-display area at an opposite side of the at least one insulating dam from the display area, the crack unit having at least a part in direct contact with the at least one insulating dam, and the crack unit comprising at least one inorganic material.

16. The organic light-emitting display apparatus of claim 15, wherein the crack unit surrounds the at least one insulating dam, and
an edge of the crack unit is connected to a lower end of a side wall of the at least one insulating dam facing the edge of the crack unit.

17. The organic light-emitting display apparatus of claim 16, wherein
the thin film transistor comprises a semiconductor layer, a gate electrode, a source electrode, and a drain electrode, wherein insulating layers are respectively arranged between the semiconductor layer, the gate electrode, the source electrode, and the drain electrode,
at least one insulating layer from among the insulating layers and the at least one inorganic layer of the thin film encapsulation layer extend to the non-display area, and
the crack unit is arranged between the at least one insulating layer and the at least one inorganic layer of the thin film encapsulation layer respectively extending to the non-display area.

18. The organic light-emitting display apparatus of claim 17, wherein
the at least one insulating dam has a stack structure comprising an insulating material including a same material as that of the at least one insulating layer, and
the at least one inorganic layer of the thin film encapsulation layer surrounds outer surfaces of the at least one insulating dam and extends to the non-display area.

19. An organic light-emitting display apparatus comprising:
a display area and a non-display area adjacent to the display area;
a first insulating dam positioned in the non-display area and completely surrounding the display area in a plan view;
a second insulating dam positioned in the non-display area and completely surrounding the first insulating dam in a plan view;
a crack unit in direct contact with the second insulating dam at a side of the second insulating dam opposite the first insulating dam;
a power source line crossing the first insulating dam and the second insulating dam,
wherein the crack unit is spaced apart from the power source line.

20. The organic light-emitting display apparatus of claim 19, further comprising an organic insulating layer positioned between the first insulating dam and the display area is a plan view.

* * * * *